United States Patent [19]

Koyama et al.

[11] Patent Number: 5,532,652
[45] Date of Patent: Jul. 2, 1996

[54] OSCILLATION CIRCUIT WITH ENABLE/DISABLE FREQUENCY STABILIZATION

[75] Inventors: Toshiaki Koyama; Shinichi Hirose; Hisashi Harada, all of Itami, Japan

[73] Assignee: Mitsubishi Denki Kabushiki Kaisha, Tokyo, Japan

[21] Appl. No.: 398,237

[22] Filed: Mar. 3, 1995

[30] Foreign Application Priority Data

Apr. 1, 1994 [JP] Japan .................................. 6-065219

[51] Int. Cl.$^6$ .............................. H03B 5/06; H03B 5/36; H03L 3/00
[52] U.S. Cl. ................... 331/116 FE; 331/108 C; 331/158; 331/173
[58] Field of Search .................... 331/57, 108 C, 331/107 R, 108 R, 116 R, 116 FE, 158, 172, 173, 175, 179, 185

[56] References Cited

U.S. PATENT DOCUMENTS

| | | | |
|---|---|---|---|
| 3,855,549 | 12/1974 | Huener et al. | 331/116 FE X |
| 4,783,620 | 11/1988 | Kitagawa et al. | 331/116 FE X |
| 5,113,156 | 5/1992 | Mahabadi et al. | 331/116 FE X |
| 5,453,719 | 9/1995 | Narahara | 331/49 |
| 5,467,028 | 11/1995 | Yoshida et al. | 331/173 X |

*Primary Examiner*—David Mis
*Attorney, Agent, or Firm*—Lowe, Price, LeBlanc & Becker

[57] ABSTRACT

An oscillation circuit in which the driving performance of a CMOS transistor therein for enabling/disabling an oscillating function is enhanced without unstabilizing the oscillation operation, by applying a higher potential to the back gate of the CMOS transistor when a signal other than an oscillation signal is inputted/outputted, and a lower potential when generating the oscillation signal.

15 Claims, 9 Drawing Sheets

OSCILLATION CIRCUIT WITH ENABLE/DISABLE FREQUENCY STABILIZATION

BACKGROUND OF THE INVENTION

Field of the Invention

The present invention relates to an oscillation circuit built in a one-chip microcomputer.

Description of Related Art

Some types of oscillation circuits built in a one-chip microcomputer are provided with a step-down regulator, which decreases a supply voltage for a semiconductor integrated circuit so as to output a stable voltage, in order to stabilize the generation of an oscillation signal by the oscillation circuit and decrease a power to be consumed.

FIG. 1 is a circuit diagram showing the configuration of an oscillation circuit with a step-down regulator formed in an N-well type CMOS semiconductor integrated circuit. As is shown in FIG. 1, a P-channel enhancement type MOS transistor (hereinafter referred to as the P-channel transistor) 1, a P-channel transistor 2, an N-channel enhancement type MOS transistor (hereinafter referred to as the N-channel transistor) 3 and a N-channel transistor 4 are connected in series. One terminal of the P-channel transistor 1 that is not connected to the P-channel transistor 2 and the back gate thereof are supplied with an output voltage RGVCC of a step-down regulator (not shown).

One terminal of the N-channel transistor 4 that is not connected to the N-channel transistor 3 is grounded. An oscillation input signal XCIN inputted by an external vibrator (not shown) is supplied to the gates of the P-channel transistor 1 and the N-channel transistor 4. An enable/disable selecting signal #CLKSTOP for enabling/disabling the oscillation circuit is supplied to the gate of the P-channel transistor 2 via an inverter 5, and is directly supplied also to the gate of the N-channel transistor 3. A supply voltage VCC for the semiconductor integrated circuit that is higher than the output voltage RGVCC of the step-down regulator is supplied to the back gate of the P-channel transistor 2. The node between the P-channel transistor 2 and the N-channel transistor 3 is connected to an oscillation output terminal XCOUT also serving as an input/output port terminal and to an input/output port signal line 10.

The operation of the oscillation circuit having the aforementioned configuration will now be described. In the following description, it is assumed that the supply voltage VCC for the semiconductor integrated circuit is, for example, 5.0 V, and that the output voltage RGVCC of the step-down regulator is, for example, 2.0 V. When the enable/disable selecting signal #CLKSTOP is at a low level, i.e., has 0 V, both the P-channel transistor 2 and the N-channel transistor 3 are off, and hence, the oscillation circuit is disabled. In this case, a signal inputted/outputted through the input/output port signal line 10 is inputted to or outputted from the oscillation output terminal XCOUT also serving as the input/output port terminal.

When the enable/disable selecting signal #CLKSTOP is at a high level, i.e., has 5.0 V, both the P-channel transistor 2 and the N-channel transistor 3 are on, thereby enabling the oscillation circuit. Under this condition, in the case where the oscillation input signal XCIN is inputted to the gates of the P-channel transistor 1 and the N-channel transistor 4, the P-channel transistor 1 is turned on when the oscillation input signal XCIN is at a low level. When the oscillation input signal XCIN is at a high level, the N-channel transistor 4 is turned on. In this manner, the P-channel transistor 1 and the N-channel transistor 4 are alternately turned on in accordance with the level of the oscillation input signal XCIN. Then, from the oscillation output terminal XCOUT also serving as the input/output port terminal is outputted a rectangular wave pulse signal, which has 0 V at a low level and 2.0 V at a high level. Therefore, in the case where a sine wave signal as is shown in FIG. 2 is inputted as the oscillation input, signal XCIN when the enable/disable selecting signal #CLKSTOP is at a high level, a rectangular wave pulse signal in accordance with the sine wave signal as is shown in FIG. 3 is outputted from the oscillation output, terminal XCOUT.

As described above, in the conventional oscillation circuit having a step-down regulator, the potential at the back gate of the P-channel transistor 2 is the supply voltage VCC for the semiconductor integrated circuit. Therefore, the larger a difference between the output voltage RGVCC of the step-down regulator and the supply voltage VCC for the semiconductor integrated circuit is, the higher the potential at the back gate of the P-channel transistor 2 is than the potential at the source thereof (i.e., the potential at the terminal connected to the P-channel transistor 1). As a result, the absolute value of the threshold voltage of the P-channel transistor 2 becomes large, thereby degrading the driving performance of the P-channel transistor 2 to supply the output voltage RGVCC of the step-down regulator to the oscillation output terminal XCOUT also serving as an input/output port terminal. Accordingly, as the supply voltage VCC is higher, there is more difficulty in the generation of an oscillation signal.

There is still another problem as follows: The voltage level of the enable/disable selecting signal #CLKSTOP for enabling the oscillation circuit is related to the supply voltage VCC. When the enable/disable selecting signal #CLKSTOP is varied due to the variation of the supply voltage VCC, the operation characteristics of the P-channel transistors 1 and 2 and the N-channel transistor 4 are not affected. The N-channel transistor 3, however, is turned on by directly receiving the enable/disable selecting signal #CLKSTOP, and hence, the variation of the supply voltage VCC varies the operation characteristic of the N-channel transistor 3. Accordingly, when the supply voltage VCC is varied, the oscillation operation becomes disadvantageously unstable.

SUMMARY OF THE INVENTION

The invention is devised to solve the aforementioned problems, and the objective of the invention is providing an oscillation circuit in which the driving performance of a transistor to supply the output power of a step-down regulator is enhanced without unstabilizing the oscillation operation so as to ensure the generation of an oscillation signal.

The oscillation circuit of the invention is formed in an N-well type CMOS semiconductor integrated circuit, and comprises switching means for switching a potential at the back gate of a first P-channel transistor for enabling/disabling an oscillating circuit between a first voltage and a second voltage higher than the first voltage.

Alternatively, the oscillation circuit of the invention is formed in a P-well type CMOS semiconductor integrated circuit, and comprises switching means for switching a potential at the back gate of a first P-channel transistor for enabling/disabling an oscillating circuit between a first voltage and a second voltage higher than the first voltage.

Therefore, in the oscillation operation, a potential difference between the back gate and the source of the first P-channel transistor is made smaller. Further, the threshold voltage and the on resistance of the transistor is prevented from increasing. Thus, an oscillation signal is generated without fail without degrading the driving performance of the transistor.

Alternatively, the oscillation circuit further comprises a third P-channel transistor and a third N-channel transistor connected to the gate of the first N-channel transistor so as to supply the first N-channel transistor with the first voltage in generating an oscillation signal and with the ground voltage in inputting/outputting a input/output signal other than the oscillation signal and the oscillation input signal.

Accordingly, since the first voltage and the ground voltage both having no voltage variation are supplied to the gate of the first N-channel transistor, the operation characteristic of the first N-channel transistor can be stabilized.

Furthermore, the oscillation circuit of the invention is formed in an N-well type or P-well type CMOS semiconductor integrated circuit, and comprises a first P-channel transistor for enabling/disabling an oscillating circuit and a fourth N-channel transistor that is supplied with a first voltage at the back gate thereof and is connected in parallel to the first P-channel transistor. The first P-channel transistor and the fourth N-channel transistor connected in parallel are synchronously turned on/off.

Accordingly, in the oscillation operation, although the driving performance of the first P-channel transistor is degraded because the potential at the back gate of the first P-channel transistor is the higher second voltage, the performance degradation is compensated by the fourth N-channel transistor because the fourth N-channel transistor is connected in parallel to the first P-channel transistor.

The above and further objects and features of the invention will more fully be apparent from the following detailed description with accompanying drawings.

DESCRIPTION OF THE PREFERRED EMBODIMENTS

The present invention will now be described referring to the accompanying drawings illustrating the embodiments thereof.

Figure 1:
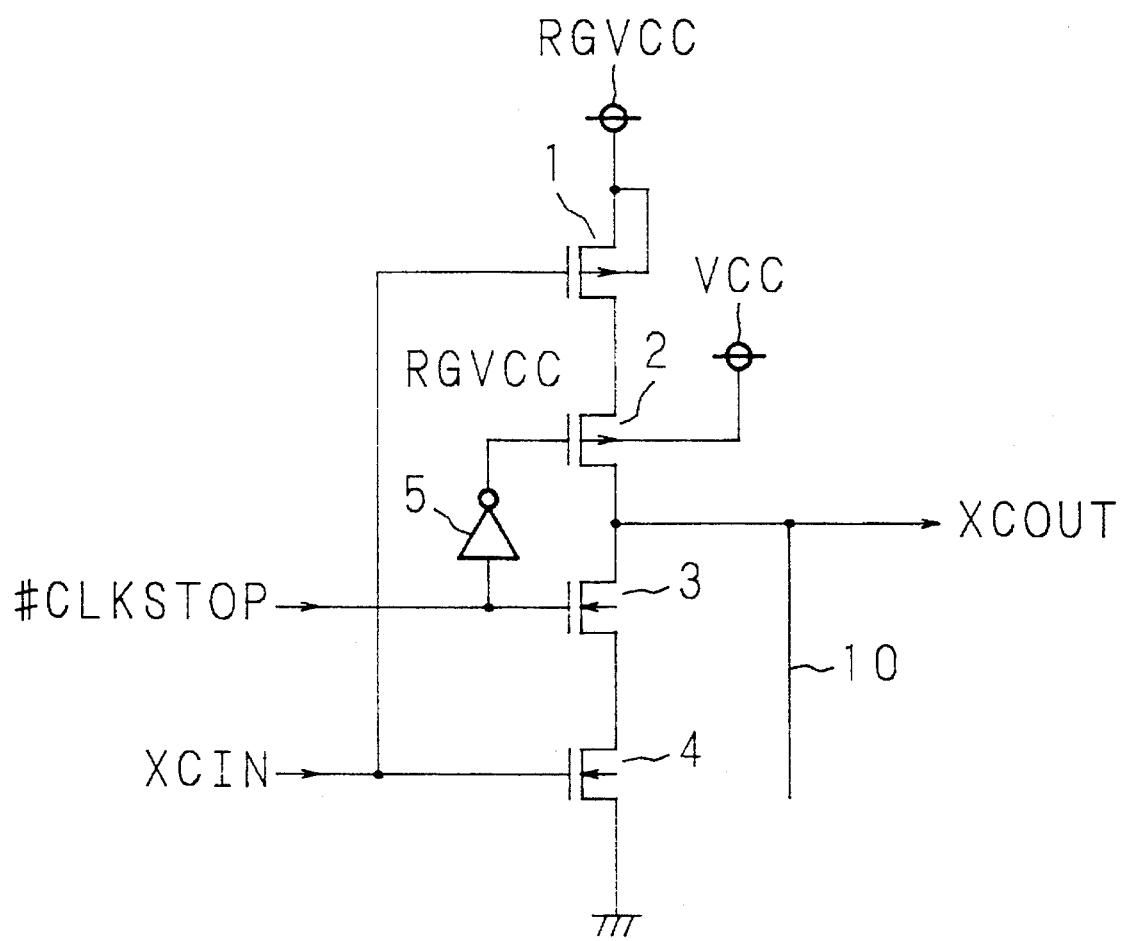
FIG. 1 is a circuit diagram showing the configuration of a conventional oscillation circuit; input signal.
Figure 2:
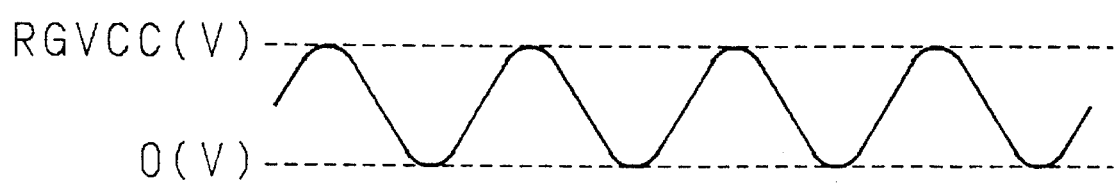
FIG. 2 shows a waveform of an ordinary oscillation
Figure 3:
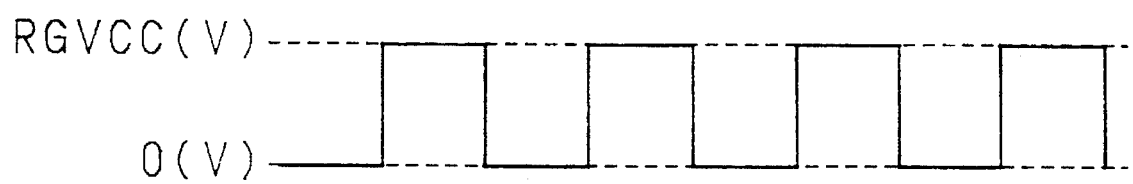
FIG. 3 shows a waveform of an ordinary signal outputted through an oscillation output terminal also serving as an input/output port terminal.
Figure 4:
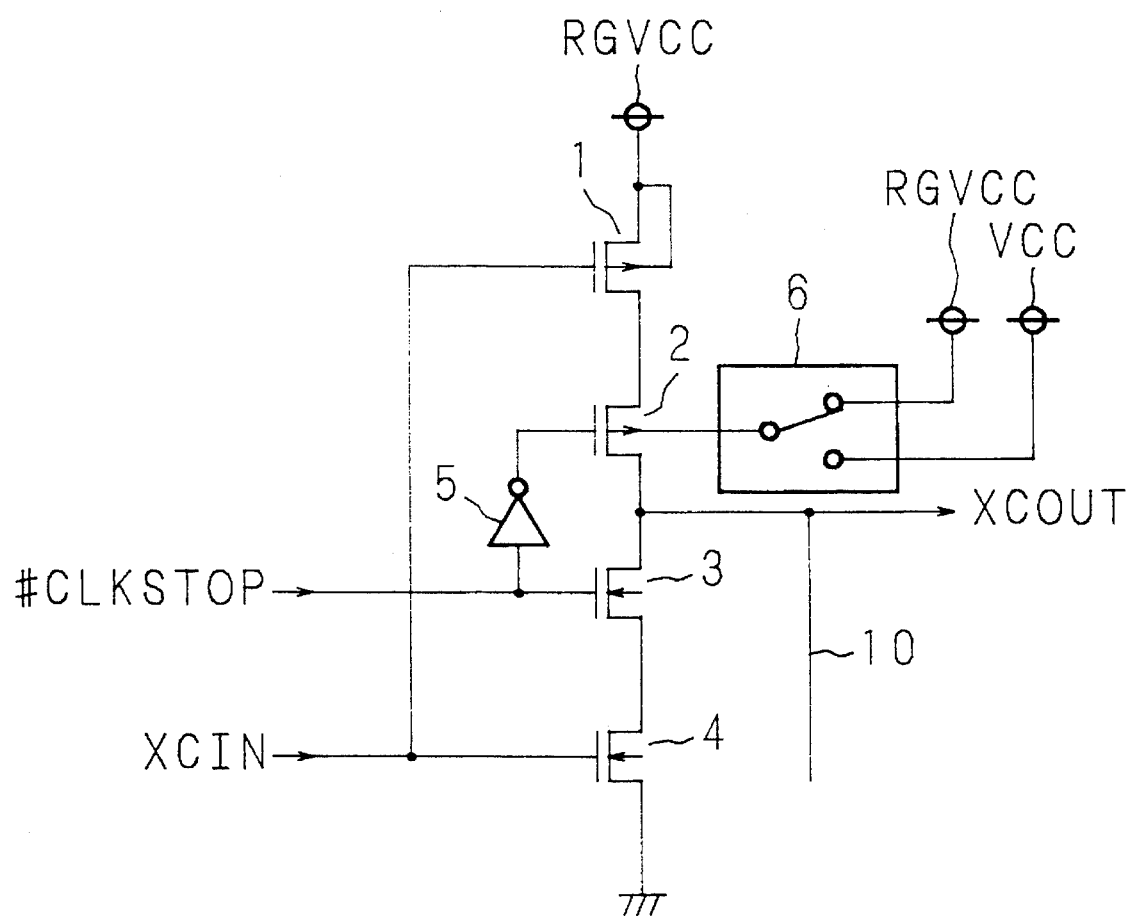
FIG. 4 is a circuit diagram showing the configuration of an oscillation circuit according to one embodiment of the invention.

FIG. 4 is a circuit diagram of the configuration of an oscillation circuit according to one embodiment of the invention. A P-channel transistor 1, another P-channel transistor 2, an N-channel transistor 3 and another N-channel transistor 4 connected in series are formed in an N-well type semiconductor integrated circuit. One terminal of the P-channel transistor 1 that is not connected to the P-channel transistor 2 and the back gate thereof are supplied with an output voltage RGVCC of a step-down regulator (not shown).

One terminal of the N-channel transistor 4 that is not connected to the N-channel transistor 3 is grounded. An oscillation input signal XCIN inputted from an external vibrator (not shown) is supplied to the gates of the P-channel transistor 1 and the N-channel transistor 4. An enable/disable selecting signal #CLKSTOP for enabling/disabling the oscillation circuit is supplied to the gate of the P-channel transistor 2 via an inverter 5, and is directly supplied also to the gate of the N-channel transistor 3. The back gate of the P-channel transistor 2 is supplied with, via a power switching circuit 6, a first voltage, that is, an output voltage RGVCC of the step-down regulator, or a second voltage, that is, a supply voltage VCC for the semiconductor integrated circuit, which is higher than the output voltage RGVCC. The node between the P-channel transistor 2 and the N-channel transistor 3 is connected to an oscillation output terminal XCOUT also serving as an input/output port terminal and to an input/output port signal line 10.

The operation of the oscillation circuit having the aforementioned configuration will now be described.

When a signal is desired to be inputted to or outputted from the oscillation output terminal XCOUT also serving as an input/output port terminal via the input/output port signal line 10, the enable/disable selecting signal #CLKSTOP is deactivated. Then, both the P-channel transistor 2 and the N-channel transistor 3 are turned off, thereby disabling the oscillation circuit. It is noted that the oscillation output terminal XCOUT works as both the input/output port terminal and the oscillation output terminal. When the power switching circuit 6 is switched so as to select the supply voltage VCC, the potential at the back gate of the P-channel transistor 2 becomes the supply voltage VCC. As a result, the signal inputted/outputted through the input/output port signal line 10 is inputted to or outputted from the oscillation output terminal XCOUT also serving as an input/output port terminal.

When an oscillation signal is desired to be generated, the enable/disable selecting signal #CLKSTOP is activated. Then, both the P-channel transistor 2 and the N-channel transistor 3 are turned on, thereby enabling the oscillation circuit. When the power switching circuit 6 is switched so as to select the output voltage RGVCC of the step-down regulator, the potential at the back gate of the P-channel transistor 2 becomes the output voltage RGVCC of the step-down regulator. Thus, a potential difference between the source and the back gate of the P-channel transistor 2 is made smaller, the threshold voltage of the P-channel transistor 2 is prevented from increasing, and the on resistance thereof is also prevented from increasing. Accordingly, the driving performance of the P-channel transistor 2 to supply the output voltage RGVCC of the step-down regulator is prevented from degrading. Thus, the oscillation circuit is prepared to generate the oscillation signal without fail.

Then, the oscillation input signal XCIN is inputted to the gates of the P-channel transistor 1 and the N-channel transistor 4, which are then turned on/off in accordance with the oscillation input signal XCIN, thereby outputting a rectangular wave pulse signal in accordance with the oscillation input signal XCIN to the oscillation output terminal XCOUT also serving as an input/output port terminal. Thus, the oscillation signal is ensured to be generated.

The behavior of the P-channel transistor 2 in the case where the oscillation circuit is in the disable/enable states will be described referring to an enlarged sectional view of the P-channel transistor 2 and the N-channel transistor 3 shown in FIG. 5.

Figure 5:
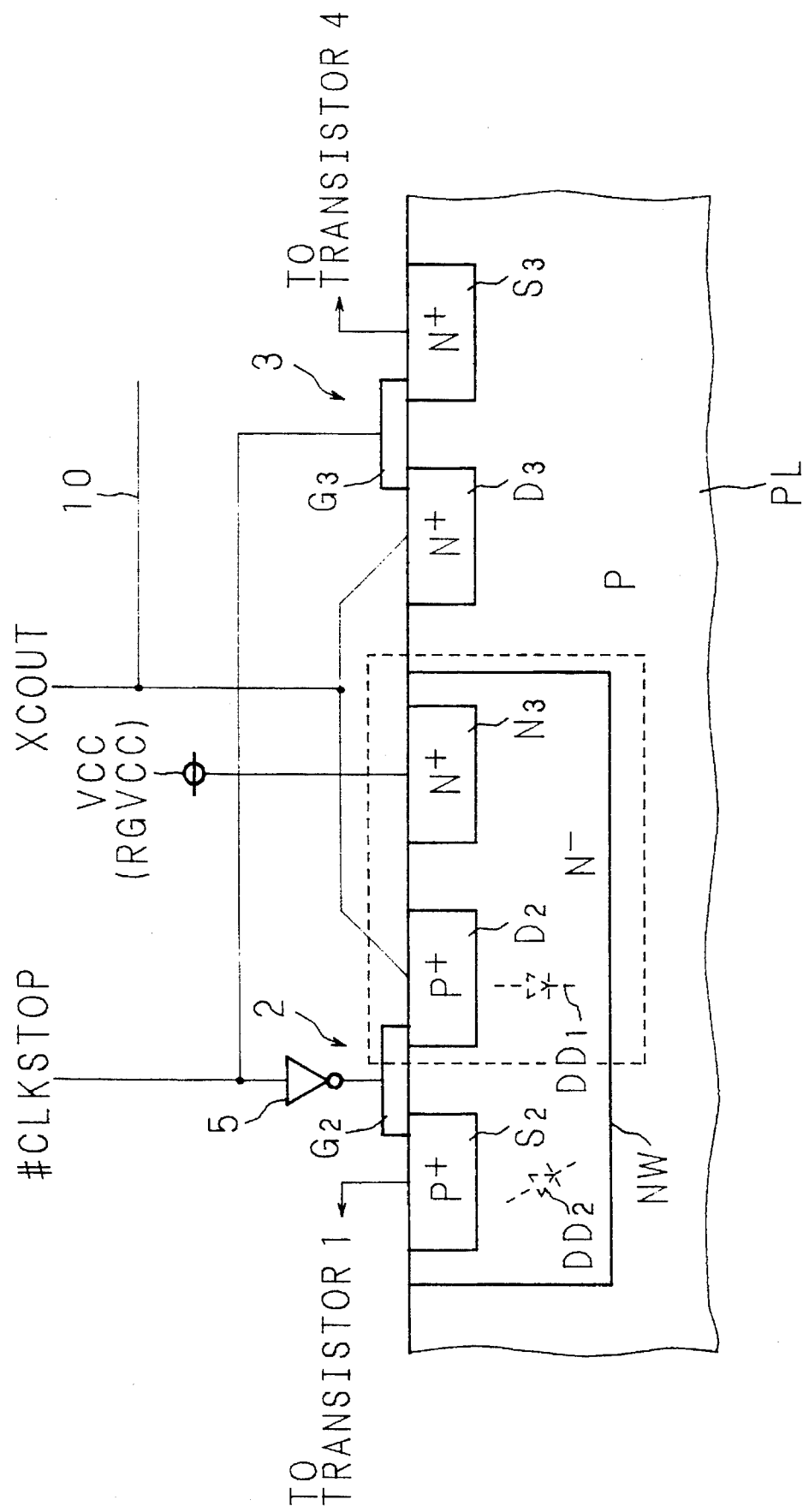
FIG. 5 is an enlarged sectional view of a P-channel transistor and an N-channel transistor in the oscillation circuit of the invention formed on an N-well type substrate.

As is shown in FIG. 5, a source $S_2$, a drain $D_2$ and an $N^+$ diffusion for supplying a stable back gate potential (hereinafter referred to as the $N^+$ diffusion region) of the P-channel transistor 2 are formed at predetermined intervals in an N-well NW of a P-type substrate PL. Further, a drain $D_3$ and a source $S_3$ of the N-channel transistor 3 are formed at predetermined distances away from the N-well NW, respectively. On the upper surface of the P-type substrate PL is formed a gate $G_2$ of the P-channel transistor 2 so as to stretch over the source $S_2$ and the drain $D_2$, and is also formed a gate $G_3$ of the N-channel transistor 3 so as to stretch over the drain $D_3$ and the source $S_3$.

The source $S_2$ of the P-channel transistor 2 is connected to the P-channel transistor 1 (as is shown in FIG. 4). The enable/disable selecting signal #CLKSTOP is inputted to the gate $G_2$ of the P-channel transistor 2 via the inverter 5, and is directly inputted to the gate $G_3$ of the N-channel transistor 3. The oscillation output terminal XCOUT is connected to the input/output port signal line 10 and the drains $D_2$ and $D_3$. The supply voltage VCC or the output voltage RGVCC of the step-down regulator is supplied to the $N^+$ diffusion region $N_3$. The source $S_3$ of the N-channel transistor 3 is connected to the N-channel transistor 4 (as is shown in FIG. 4).

When the oscillation circuit is in the disable state as described above, the back gate of the P-channel transistor 2, i.e., the $N^+$ diffusion region $N_3$, is supplied with the supply voltage VCC, and also a reverse bias voltage is supplied to a diode $DD_1$ formed by a parasitic PN junction. As a result, a current does not flow through the PN junction, and therefore, the signal inputted/outputted via the input/output port signal line 10 is accurately inputted to or outputted from the oscillation output terminal XCOUT also serving as an input/output port terminal. At this point, since the P-channel transistor 2 is off, the variation in the voltage level of the enable/disable selecting signal #CLKSTOP does not affect the operation characteristic of the P-channel transistor 2.

When the oscillation circuit is in the enable state, the back gate of the P-channel transistor 2, i.e., the $N^+$ diffusion region $N_3$, is supplied with the output voltage RGVCC of the step-down regulator lower than the supply voltage VCC. Further, the source $S_2$ of the P-channel transistor 2 is supplied with a voltage slightly lower than the output voltage RGVCC of the step-down regulator by the P-channel transistor 1. Therefore, a diode $DD_2$ formed by the parasitic PN junction is supplied with a reverse bias voltage, thereby preventing a current from flowing through the PN junction. In addition, the back gate voltage of the P-channel transistor 2 is lower than the supply voltage VCC, and the potential difference between the back gate and the source of the P-channel transistor 2 is small, thereby preventing the threshold voltage of the P-channel transistor 2 from increasing. As a result, the driving performance of the P-channel transistor 2 to supply the output voltage RGVCC of the step-down regulator is not degraded, and the on resistance of the P-channel transistor 2 is prevented from increasing. Thus, the oscillation signal is generated without fail.

In this manner, when a P-channel transistor 2 and a N-channel transistor 3 are turned off, the oscillation circuit is disabled in this embodiment. Then, when the back gate of the P-channel transistor 2 is supplied with a second voltage higher than a first voltage, a parasitic PN junction in the P-channel transistor 2 is supplied with a reverse bias voltage, thereby accurately inputting/outputting a signal other than the oscillation signal. In the case where the oscillation signal is desired to be generated, the first P-channel transistor 2 and the N-channel transistor 3 are turned on, thereby enabling the oscillation circuit. Then, the back gate of the P-channel transistor 2 is supplied with the first voltage. As a result, a potential difference between the back gate and the source of the P-channel transistor 2 is made smaller, and the threshold voltage and the on resistance of the P-channel transistor 2 are prevented from increasing. Further, since a reverse bias voltage is supplied to a parasitic PN junction, the driving performance of the P-channel transistor 2 is prevented from degrading, thereby ensuring the generation of the oscillation signal.

Figure 6:
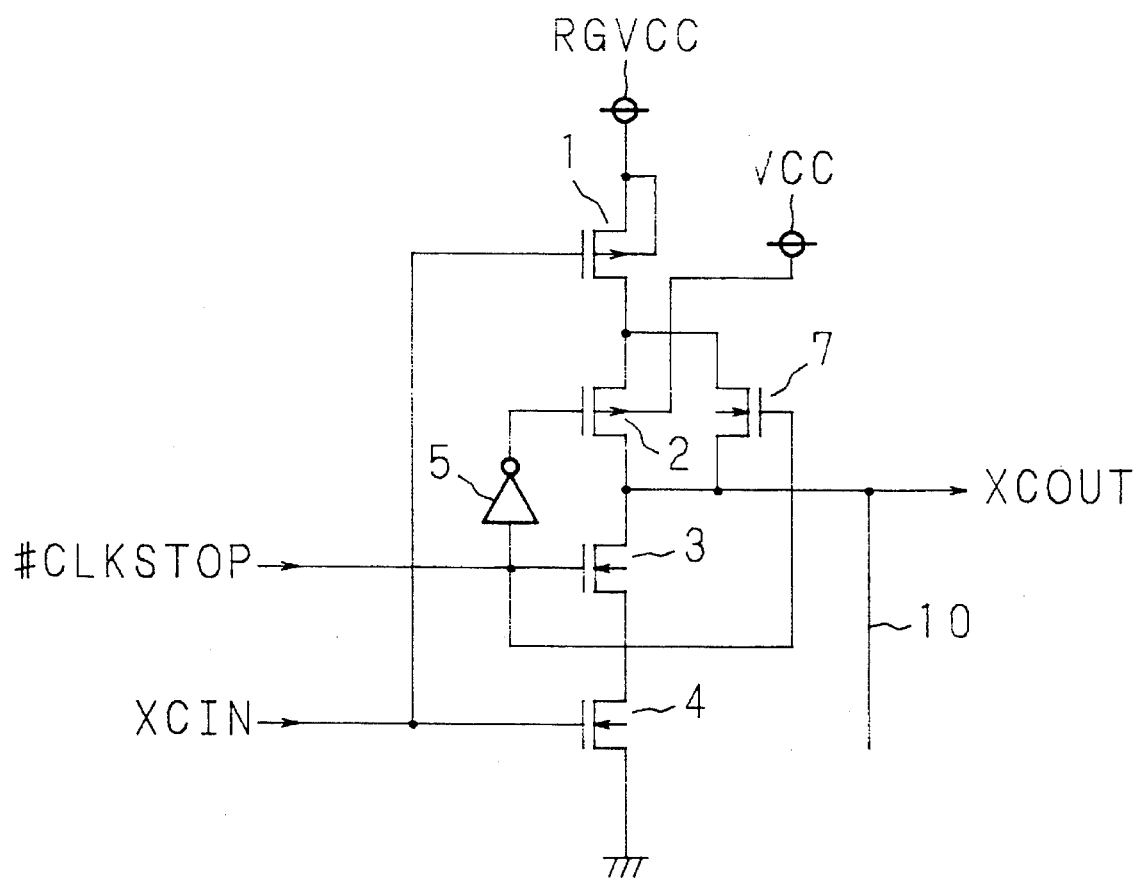
FIG. 6 is a circuit diagram of the configuration of an oscillation circuit according to another embodiment of the invention.

FIG. 6 is a circuit diagram showing the configuration of an oscillation circuit according to another embodiment of the invention. This configuration is basically identical to that shown in FIG. 4 except for the following, and therefore, the same reference numerals are used to refer to the same elements shown in FIG. 4 and the description thereof is omitted. In this embodiment, an N-channel transistor 7 is connected in parallel to the P-channel transistor 2. The back gate of the P-channel transistor 2 is supplied with the supply voltage VCC, and the gate of the N-channel transistor is supplied with the enable/disable selecting signal #CLKSTOP.

The operation of this oscillation circuit will now be described. When a signal is desired to be inputted in or outputted from the oscillation output, terminal XCOUT serving also as the input/output port terminal via the input/output port signal line 10, the enable/disable signal #CLKSTOP is deactivated. As a result, the P-channel transistor 2, the N-channel transistor 3 and the N-channel transistor 7 are all turned off, thereby disabling the oscillation circuit. Since the potential at the back gate of the P-channel transistor 2 is the supply voltage VCC, the parasitic PN junction in the P-channel transistor 2 is supplied with a reverse bias voltage as described above, regardless of the level of the signal inputted to or outputted from the oscillation output terminal XCOUT also serving as an input/output port terminal. Therefore, a current does not flow through the PN junction, resulting in accurately inputting/outputting the signal.

When the oscillation signal is desired to be generated, the enable/disable selecting signal #CLKSTOP is activated. As a result, the P-channel transistor 2 and the N-channel transistors 3 and 7 are all turned on, thereby enabling the oscillation circuit. Since the supply voltage VCC is supplied to the back gate of the P-channel transistor 2, the threshold voltage of the P-channel transistor 2 is increased, the on resistance is also increased, and the driving performance of the P-channel transistor 2 to supply the output voltage RGVCC of the step-down regulator is degraded. The on resistance of the N-channel transistor 7 is, however, decreased as the voltage level of the enable/disable selecting signal #CLKSTOP becomes higher. Therefore, the N-channel transistor 7 connected in parallel to the P-channel transistor 2 can compensate the characteristic degradation caused by the degradation of the driving performance of the P-channel transistor 2. As a result, it is ensured that the oscillation circuit is prepared to generate the oscillation signal. Then, in response to the oscillation input signal XCIN, the output voltage RGVCC of the step-down regulator is also outputted to the oscillation output terminal XCOUT also serving as an input/output port terminal via the parallel circuit formed by the P-channel transistor 2 and the N-channel transistor 7, thereby generating the oscillation signal without fail.

In this configuration, since a N-channel transistor 3 is turned on by supplying the gate thereof with a first voltage having no voltage variation, the operation characteristic of the N-channel transistor 3 can be stabilized. Therefore, the oscillation circuit can surely generate the oscillation signal, and the oscillation operation thereof can be stabilized.

Figure 7:
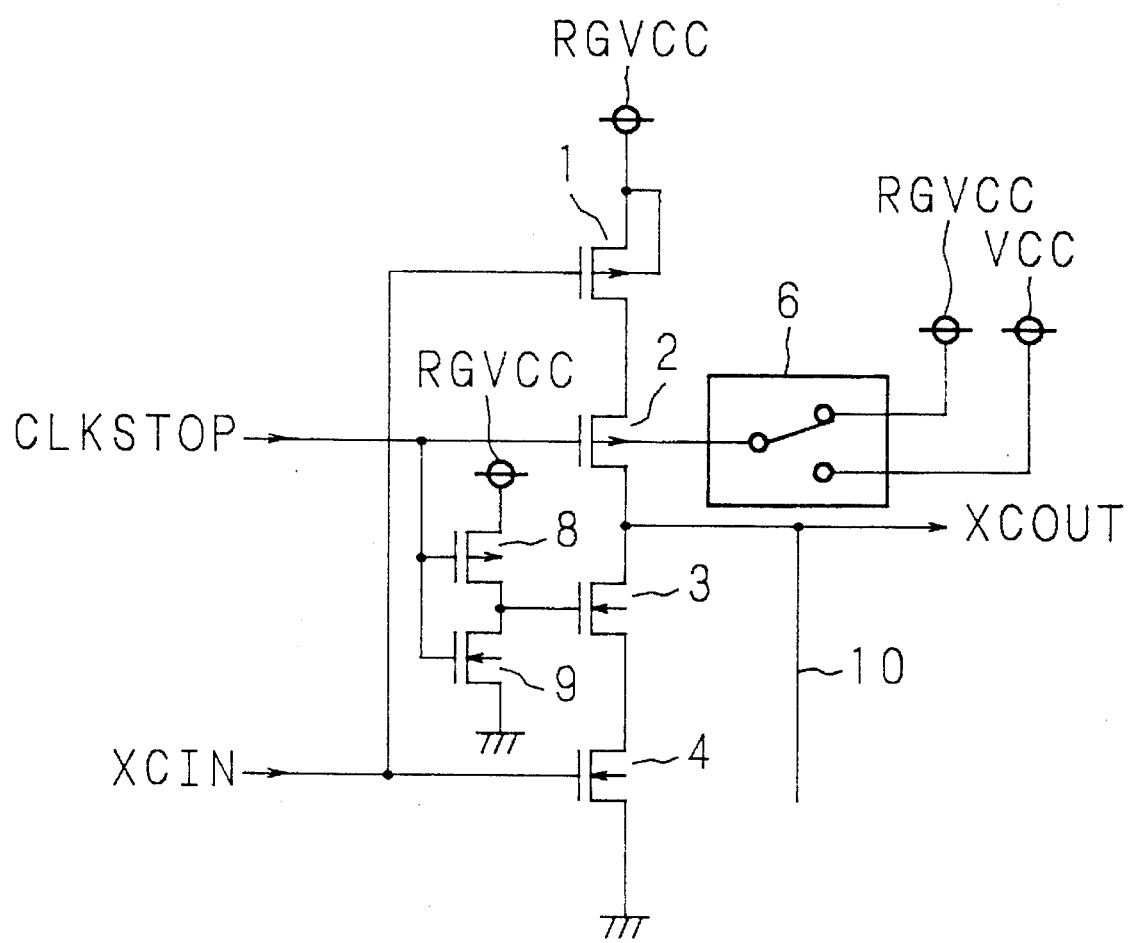
FIG. 7 is a circuit diagram of the configuration of an oscillation circuit according to still another embodiment of the invention.

FIG. 7 is a circuit diagram showing the configuration of an oscillation circuit according to still another embodiment of the invention. In this configuration, a P-channel transistor 8 and an N-channel transistor 9 are connected to each other in series, and one terminal of the P-channel transistor 8 that is not connected to the N-channel transistor 9 is supplied with the output voltage RGVCC of the step-down regulator. One terminal of the N-channel transistor 9 that is not connected to the P-channel transistor 8 is grounded. An enable/disable selecting signal CLKSTOP is supplied to the gates of the P-channel transistors 2 and 8 and the N-channel transistor 9. The node between the P-channel transistor 8 and the N-channel transistor 9 is connected to the gate of the N-channel transistor 3. The rest of the configuration is identical to that shown in FIG. 4, and therefore, the same reference numerals are used to refer to the same elements used in FIG. 4, and the description is omitted.

The operation of this oscillation circuit will be described. When a signal other than the oscillation signal is desired to be inputted/outputted, the enable/disable selecting signal CLKSTOP is activated, thereby turning off the P-channel transistor 2. Further, the N-channel transistor 9 is turned on, thereby supplying a ground voltage to the gate of the N-channel transistor 3. As a result, the N-channel transistor 3 is turned off, thereby disabling the oscillation circuit. Furthermore, the power switching circuit 6 is switched so as to select the supply voltage VCC, which is supplied to the back gate of the P-channel transistor 2. As a result, the parasitic PN junction in the P-channel transistor 2 is supplied with the reverse bias voltage as described above. Thus, the signal can be surely inputted to or outputted from the oscillation output terminal XCOUT serving also as an input/output port terminal via the input/output port signal line 10.

When the oscillation signal is desired to be generated, the enable/disable selecting signal CLKSTOP is deactivated, thereby turning on the P-channel transistor 2. Further, the P-channel transistor 8 is turned on and the N-channel transistor 9 is turned off, resulting in supplying the output voltage RGVCC of the step-down regulator to the gate of the N-channel transistor 3. Therefore, the N-channel transistor 3 is turned on, thereby enabling the oscillation circuit.

Then, the power switching circuit 6 is switched so as to select the output voltage RGVCC of the step-down regulator, which is supplied to the back gate of the P-channel transistor 2. As a result, a potential difference between the back gate and the source of the P-channel transistor 2 is made smaller, the threshold voltage and the on resistance thereof are prevented from increasing. Further, the parasitic PN junction is supplied with the reverse bias voltage as described above. Thus, the oscillation signal is generated without fail. In this case, since the gate of the N-channel transistor 3 is supplied with the output voltage RGVCC of the step-down regulator via the P-channel transistor 8, the N-channel transistor 3 is not affected by the variation of the enable/disable selecting signal CLKSTOP caused by the variation of the supply voltage VCC. Accordingly, the driving performance of the P-channel transistor 2 to supply the output voltage RGVCC of the step-down regulator is prevented from degrading in this oscillation circuit, thereby ensuring the generation of the oscillation signal. Further, since the gate of the N-channel transistor 3 is supplied with the stable output voltage RGVCC of the step-down regulator, the operation characteristic of the N-channel transistor 3 can be stabilized, resulting in stabilizing the oscillation operation as well.

In this case, however, since the gate voltage of the N-channel transistor 3 is lower than that in a conventional oscillation circuit, the beta of the N-channel transistor 3 is required to be increased to enhance the driving performance thereof.

In this manner, in this embodiment, a N-channel transistor 3 for enabling/disabling an oscillating circuit is supplied with a ground voltage via an N-channel transistor 4 that is turned on/off in accordance with an oscillation input signal. The oscillation circuit is disabled by turning off a P-channel transistor 2 for enabling/disabling the oscillating circuit, a N-channel transistor 7 connected in parallel to the P-channel transistor 2 and the N-channel transistor 3. When the back gate of the P-channel transistor 2 is supplied with a second voltage higher than a first voltage, the parasitic PN junction in the P-channel transistor 2 is supplied with a reverse bias voltage. As a result, a signal other than an oscillation signal can be accurately inputted/outputted.

When the oscillation signal is desired to be generated, the P-channel transistor 2, the N-channel transistor 7 connected in parallel to the P-channel transistor 2 and the N-channel transistor 3 are turned on, thereby enabling the oscillation circuit. When the back gate of the P-channel transistor 2 is supplied with the second voltage, the on resistance thereof is increased, resulting in degrading the driving performance thereof, which leads to the degradation of the characteristic thereof. This degradation of the operation characteristic of the P-channel transistor 2 is, however, compensated by the N-channel transistor 7 that is turned on with a lower on resistance. In this manner, the oscillation signal can be generated without fail.

Figure 8:
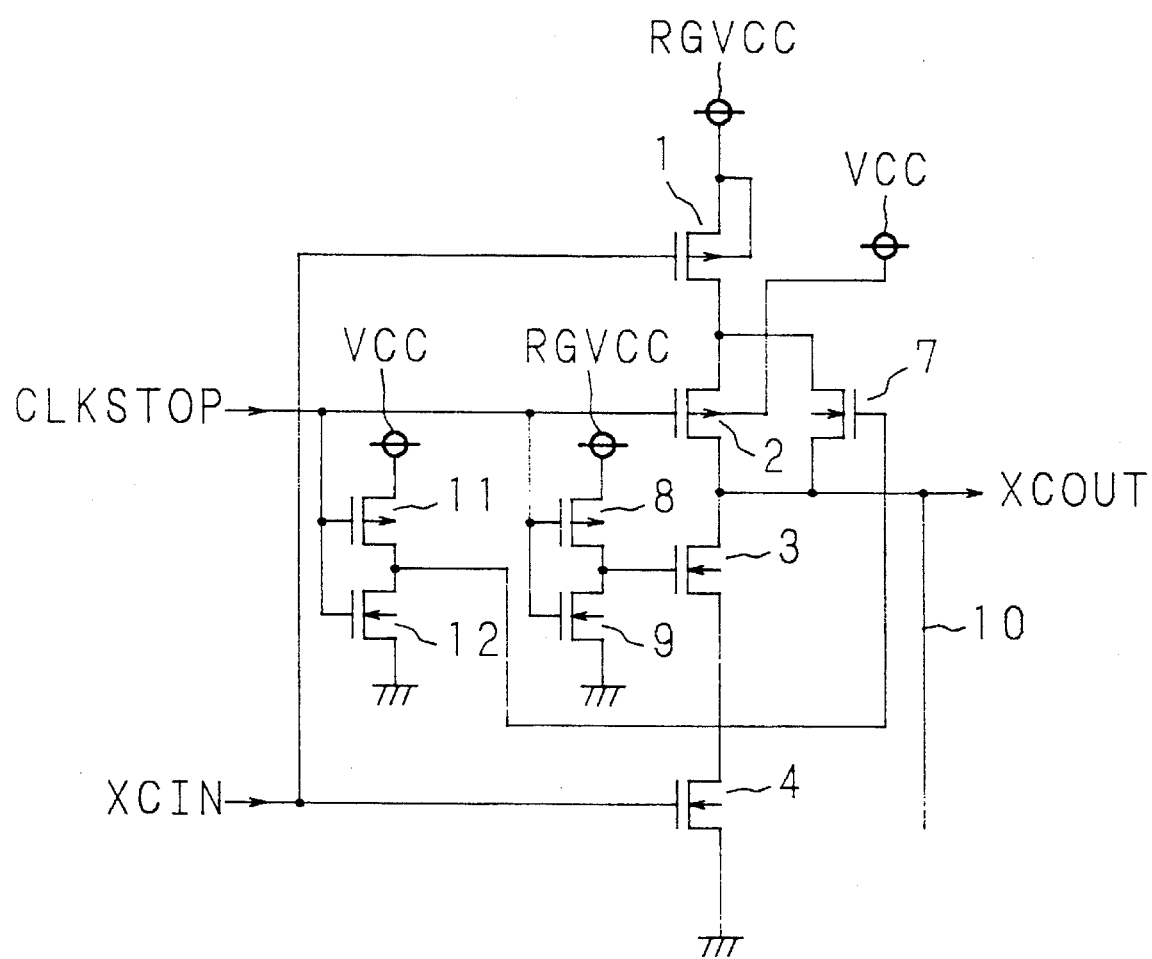
FIG. 8 is a circuit diagram of the configuration of an oscillation circuit according to still another embodiment of the invention.

FIG. 8 is a circuit diagram showing the configuration of an oscillation circuit according to still another embodiment of the invention. A P-channel transistor 8 and an N-channel transistor 9 are connected to each other in series, and the output voltage RGVCC of the step-down regulator is supplied to one terminal of the P-channel transistor 8 that is not connected to the N-channel transistor 9. One terminal of the N-channel transistor 9 that is not connected to the P-channel transistor 8 is grounded. The enable/disable selecting signal CLKSTOP is supplied to the gates of the P-channel transistor 8 and the N-channel transistor 9. The node between the P-channel transistor 8 and the N-channel transistor 9 is connected to the gate of the N-channel transistor 3.

Further, a P-channel transistor 11 and an N-channel transistor 12 are connected to each other in series, and the supply voltage VCC is supplied to one terminal of the P-channel transistor 11 that is not connected to the N-channel transistor 12. One terminal of the N-channel transistor 12 that is not connected to the P-channel transistor 11 is grounded. The enable/disable selecting signal CLKSTOP is supplied to the gates of the P-channel transistor 11 and the N-channel transistor 12. The node between the P-channel transistor 11 and the N-channel transistor 12 is connected to the gate of the N-channel transistor 7. The enable/disable selecting signal CLKSTOP is supplied to the gate of the P-channel transistor 2. The rest of the configuration is identical to that shown in FIG. 6, and hence, the same reference numerals are used to refer to the same elements used in FIG. 6 and the description is omitted.

The operation of this oscillation circuit will be described. When a signal other than an oscillation signal is desired to be inputted/outputted, the enable/disable selecting signal CLKSTOP is activated, thereby turning off the P-channel transistor 2. Further, the P-channel transistors 8 and 11 are both turned off, and the N-channel transistors 9 and 12 are both turned on. As a result, the gates of the N-channel transistors 3 and 7 are supplied with the ground voltage, thereby turning off the N-channel transistors 3 and 7. The oscillation circuit is thus disabled. Since the potential at the back gate of the P-channel transistor 2 is the supply voltage VCC, a parasitic PN junction in the P-channel transistor 2 is supplied with a reverse bias voltage as described above, regardless of the level of the signal inputted to or outputted from the oscillation output terminal XCOUT serving also as an input/output port terminal. Therefore, the signal can be accurately inputted/outputted.

When the oscillation signal is desired to be generated, the enable/disable selecting signal CLKSTOP is deactivated, thereby turning on the P-channel transistor 2. Further, the P-channel transistors 8 and 11 are both turned on, and the N-channel transistors 9 and 12 are both turned off. As a result, the gate of the N-channel transistor 3 is supplied with the output voltage RGVCC of the step-down regulator, and the gate of the N-channel transistor 7 is supplied with the supply voltage VCC, thereby turning on the N-channel transistors 3 and 7. Thus, the oscillation circuit is enabled. In this case, since the back gate of the P-channel transistor 2 is supplied with the supply voltage VCC, the threshold voltage and the on resistance of the P-channel transistor 2 are increased, resulting in degrading the driving performance of the P-channel transistor 2 to supply the output voltage RGVCC of the step-down regulator. The on resistance of the N-channel transistor 7 is, however, largely decreased because the gate thereof is supplied with the supply voltage VCC, and hence, the N-channel transistor 7 connected in parallel to the P-channel transistor 2 compensates the degradation of the operation characteristic caused by the degradation of the driving performance of the P-channel transistor 2.

In this manner, the output voltage RGVCC of the step-down regulator is outputted in accordance with the oscillation input signal XCIN via the parallel circuit formed by the P-channel transistor 2 and the N-channel transistor 7, resulting in ensured generation of the oscillation signal. Moreover, since the gate of the N-channel transistor 3 is supplied with the output voltage RGVCC of the step-down regulator, the N-channel transistor 3 is not affected by the variation in the enable/disable selecting signal CLKSTOP caused by the variation of the supply voltage VCC, resulting in stabilizing the operation characteristic. In this manner, the degradation of the characteristic of the P-channel transistor 2 to supply the output voltage RGVCC of the step-down regulator in accordance with the oscillation input signal XCIN can be compensated by the N-channel transistor 7 so as to ensure the generation of the oscillation signal and stabilize the oscillation operation. In this case, however, since the gate voltage of the N-channel transistor 3 is lower than the supply voltage VCC, the beta of the N-channel transistor 3 is required to be increased to enhance the driving performance thereof.

In this embodiment, a N-channel transistor 3 is turned on by supplying a first voltage having no voltage variation to the gate thereof, thereby stabilizing the operation characteristic of the N-channel transistor 3 and ensuring the generation of the oscillation signal by the oscillation circuit. Further, the oscillation operation can be stabilized.

In the embodiments described referring to FIGS. 4 and 7, the back gate potential of the P-channel transistor 2 is switched between the supply voltage VCC and the output voltage RGVCC of the step-down regulator by using the power switching circuit 6. The same effect can be attained as follows: The back gate potential of the P-channel transistor 2 is supplied with the output voltage RGVCC of the step-down regulator, and the output voltage RGVCC of the step-down regulator is switched to be identical to the supply voltage VCC.

Further, although the oscillation circuit is formed in an N-well type CMOS semiconductor integrated circuit in the above-mentioned embodiments, it can be formed in a P-well type CMOS semiconductor integrated circuit. Also in this case, the same effect can be achieved by forming an appropriate well as follows.

Figure 9:
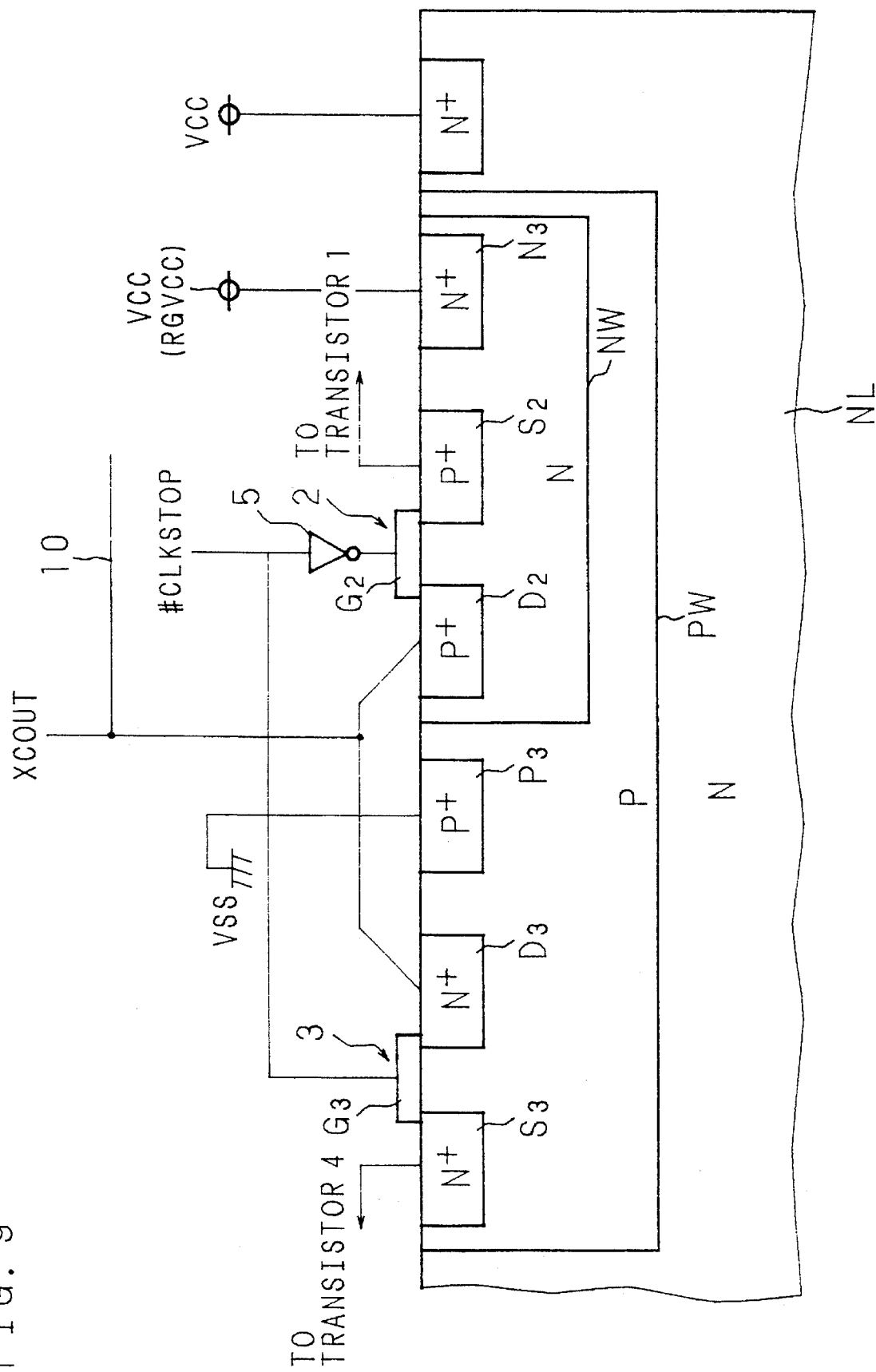
FIG. 9 is an enlarged sectional view of a P-channel transistor and an N-channel transistor in the oscillation circuit of the invention formed on a P-well type substrate.

FIG. 9 is an enlarged sectional view of an N-channel transistor 3 and a P-channel transistor 2 formed in a P-well type CMOS semiconductor integrated circuit. As is shown in FIG. 9, a source $S_3$, a drain $D_3$ and $P^+$ diffusion for supplying a ground voltage (hereinafter referred to as the $P^+$ diffusion region) $P_3$ of the N-channel transistor 3 are formed at predetermined intervals in a P-well PW of an N-type substrate NL. An N-well NW is formed at a predetermined distance away from the $P^+$ diffusion region $P_3$, and in the N-well NW, a drain $D_2$, a source $S_2$ and $N^+$ diffusion for supplying a stable back gate potential (hereinafter referred to as the $N^+$ diffusion region) $N_3$ of the P-channel transistor 2 are formed at predetermined intervals. On the upper surface of the N-type substrate NL is formed a gate $G_3$ of the N-channel transistor 3 so as to stretch over the drain $D_3$ and the source $S_3$, and is also formed a gate $G_2$ of the P-channel transistor 2 so as to stretch over the source $S_2$ and the drain $D_2$.

The source $S_2$ of the P-channel transistor 2 is connected to the P-channel transistor 1 (as is shown in FIG. 4). The enable/disable selecting signal #CLKSTOP is supplied to the gate $G_2$ of the P-channel transistor 2 via the inverter 5, and is directly supplied to the gate $G_3$ of the N-channel transistor 3. The oscillation output terminal XCOUT is connected to the input/output port signal line 10 and the drains $D_2$ and $D_3$. The supply voltage VCC or the output voltage RGVCC of the step-down regulator is supplied to the $N^+$ diffusion region $N_3$. The source $S_3$ of the N-channel transistor 3 is connected to the N-channel transistor 4 (as is shown in FIG. 4).

By forming the N-channel transistor 3 and the P-channel transistor 2 in this manner, the oscillation circuit having the configuration as shown in any of FIGS. 4, 6, 7 and 8 can be formed in the P-well type CMOS semiconductor integrated circuit.

As described above, the oscillation circuit of the present invention comprises means for switching the potential at the back gate of the P-channel transistor 2 for enabling/disabling an oscillation circuit between the first voltage and the second voltage higher than the first voltage, and the first voltage can be supplied to the back gate in the oscillation operation. Therefore, even when there is a big potential difference between the first voltage and the second voltage, the threshold voltage of the P-channel transistor is not increased, resulting in providing an oscillation circuit that can surely generate an oscillation signal without causing the degradation of the driving performance of the P-channel transistor. Further, since the gate of the N-channel transistor 3 is supplied with the first voltage, the oscillation operation can be stabilized.

In the present invention, a P-channel transistor for enabling/disabling the oscillation circuit is connected in parallel to a N-channel transistor, and the P-channel transistor and the N-channel transistors are turned on/off together. Accordingly, even when the threshold voltage of the P-channel transistor is increased to degrade the characteristic thereof, the N-channel transistor, which is turned on with a lower on resistance, can compensate the degradation of the characteristic of the P-channel transistor. As a result, an oscillation circuit that generates an oscillation signal without fail can be provided. Further, the oscillation operation can be stabilized by supplying the first voltage to the gate of a N-channel transistor connected in series to the P-channel transistor. In addition, the generation of the oscillation signal can be ensured by supplying the second voltage to the gate of the N-channel transistor.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An oscillation circuit formed in an N-well type CMOS semiconductor integrated circuit for outputting an oscillation signal based on an oscillation input signal and inputting an input signal and outputting an output signal, comprising:

a first P-channel transistor and a first N-channel transistor connected in series to each other for allowing said oscillation circuit to be in one of an enable state where said oscillation circuit can output said oscillation signal and a disable state where said oscillation circuit can input said input signal and output said output signal;

a second P-channel transistor through which a first voltage is supplied to said first P-channel transistor and which is turned on or off in accordance with said oscillation input signal;

a second N-channel transistor through which a ground voltage is supplied to said first N-channel transistor and which is turned on or off in accordance with said oscillation input signal; and switching means for switching a voltage to be supplied to the back gate of said first P-channel transistor between said first voltage and a second voltage higher than said first voltage.

2. An oscillation circuit according to claim 1, wherein said switching means selects said first voltage when said oscillation circuit is in said enable state and selects said second voltage when said oscillation circuit is in said disable state.

3. An oscillation circuit according to claim 1, further comprising:

a third P-channel transistor and a third N-channel transistor connected to the gate of said first N-channel transistor so as to supply said first N-channel transistor with said first voltage when said oscillation circuit is in said enable state and with said ground voltage when said oscillation circuit is in said disable state.

4. An oscillation circuit according to claim 2, further comprising:

a third P-channel transistor and a third N-channel transistor connected to the gate of said first N-channel transistor so as to supply said first N-channel transistor with said first voltage when said oscillation circuit is in said enable state and with said ground voltage when said oscillation circuit is in said disable state.

5. An oscillation circuit formed in a P-well type CMOS semiconductor integrated circuit, for outputting an oscillation signal based on an oscillation input signal and inputting an input signal and outputting an output signal, comprising:

a first P-channel transistor and a first N-channel transistor connected in series to each other for allowing said oscillation circuit to be in one of an enable state where said oscillation circuit can output said oscillation signal and a disable state where said oscillation circuit can input said input signal and output said output signal;

a second P-channel transistor through which a first voltage is supplied to said first P-channel transistor and which is turned on or off in accordance with said oscillation input signal;

a second N-channel transistor through which a ground voltage is supplied to said first N-channel transistor and which is turned on or off in accordance with said oscillation input signal; and switching means for switching a voltage to be supplied to the back gate of said first P-channel transistor between said first voltage and a second voltage higher than said first voltage.

6. An oscillation circuit according to claim 5, wherein said switching means selects said first voltage when said oscillation circuit is in said enable state and selects said second voltage when said oscillation circuit is in the disable state.

7. An oscillation circuit according to claim 5, further comprising:

a third P-channel transistor and a third N-channel transistor connected to the gate of said first N-channel transistor so as to supply said first N-channel transistor with said first voltage when said oscillation circuit is in said enable state and with said ground voltage when said oscillation circuit is in said disable state.

8. An oscillation circuit according to claim 6, further comprising:

a third P-channel transistor and a third N-channel transistor connected to the gate of said first N-channel transistor so as to supply said first N-channel transistor with said first voltage when said oscillation circuit is in said enable state and with said ground voltage when said oscillation circuit is in said disable state.

9. An oscillation circuit formed in a N-well type CMOS semiconductor integrated circuit, for outputting an oscillation signal based on an oscillation input signal and inputting an input signal and outputting an output signal, comprising:

a first P-channel transistor and a first N-channel transistor connected in series to each other for allowing said oscillation circuit to be in one of an enable state where said oscillation circuit can output said oscillation signal and a disable state where said oscillation circuit can input said input signal and output said output signal;

a second P-channel transistor through which a first voltage is supplied to said first P-channel transistor and which is turned on or off in accordance with said oscillation input signal;

a second N-channel transistor through which a ground voltage is supplied to said first N-channel transistor and which is turned on or off in accordance with said oscillation input signal; and a third N-channel transistor connected in parallel to said first P-channel transistor and supplied with said first voltage, wherein a second voltage higher than said first voltage is supplied to the back gate of said first P-channel transistor, and said first P-channel transistor and said third N-channel transistor are turned on or off synchronously.

10. An oscillation circuit according to claim 9, further comprising:

a fourth P-channel transistor and a third N-channel transistor connected to the gate of said first N-channel transistor so as to supply said first N-channel transistor with said first voltage when said oscillation circuit is in said enable state and with said ground voltage when said oscillation circuit is in said disable state.

11. An oscillation circuit formed in a P-well type CMOS semiconductor integrated circuit, for outputting an oscillation signal based on an oscillation input signal and inputting an input signal and outputting an output signal, comprising:

a first P-channel transistor and a first N-channel transistor connected in series to each other for allowing said oscillation circuit to be in one of an enable state where said oscillation circuit can output said oscillation signal and a disable state where said oscillation circuit can input said input signal and output said output signal;

a second P-channel transistor through which a first voltage is supplied to said first P-channel transistor and which is turned on or off in accordance with said oscillation input signal;

a second N-channel transistor through which a ground voltage is supplied to said first N-channel transistor and which is turned on or off in accordance with said oscillation input signal; and a third N-channel transistor connected in parallel to said first P-channel transistor and supplied with said first voltage, wherein a second voltage higher than said first voltage is supplied to the back gate of said first P-channel transistor, and said first P-channel transistor and said third N-channel transistor are turned on or off synchronously.

12. An oscillation circuit according to claim 11, further comprising:

a fourth P-channel transistor and a third N-channel transistor connected to the gate of said first N-channel transistor so as to supply said first N-channel transistor with said first voltage when said oscillation circuit is in said enable state and with said ground voltage when said oscillation circuit is in said disable state.

13. An oscillation circuit in a semiconductor integrated circuit, outputting an oscillation signal based on an oscillation input signal oscillating between a first voltage and a second voltage, and inputting an input signal and outputting an output signal, comprising:

transistor means having a threshold voltage and including a back gate receiving a potential, for allowing said oscillation circuit to be in one of an enable state where said oscillation circuit can output said oscillation signal and a disable state where said oscillation circuit can input said input signal and output said output signal;

switching means, operatively connected to said transistor means, for switching the potential at the back gate of said transistor means for enabling or disabling the oscillation between the first voltage and the second voltage, and for supplying the first voltage to the back gate of said transistor means, stabilizing the oscillation of said oscillation circuit and the threshold voltage of said transistor means.

14. An oscillation circuit according to claim 13, wherein said transistor means comprises first and second transistors connected in parallel, and said first and second transistors being turned on and off together, permitting one of the first and second transistors to compensate for a threshold voltage increase in another of the first and second transistors.

15. An oscillation circuit according to claim 14, wherein said first and second transistors comprise a P-channel transistor and an N-channel transistor respectively.

* * * * *